United States Patent
Okuhara et al.

[11] 4,130,767
[45] Dec. 19, 1978

[54] SEMICONDUCTOR SWITCH

[75] Inventors: Shinzi Okuhara, Fujisawa; Ichiro Ohhinata, Yokohama, both of Japan

[73] Assignee: Hitachi, Ltd., Japan

[21] Appl. No.: 695,758

[22] Filed: Jun. 14, 1976

[30] Foreign Application Priority Data

Jun. 18, 1975 [JP] Japan .................................. 50-73187

[51] Int. Cl.² ............................................. H03K 17/72
[52] U.S. Cl. .................. 307/252 T; 307/305; 323/225 C; 323/24
[58] Field of Search .......... 307/252 A, 252 D, 252 G, 307/252 T, 305; 323/225 C, 24

[56] References Cited
U.S. PATENT DOCUMENTS

| | | | |
|---|---|---|---|
| 3,097,314 | 7/1963 | Harriman | 232/24 X |
| 3,436,645 | 4/1969 | Johnson et al. | 323/24 |
| 3,553,495 | 1/1971 | Shaugnessy | 307/252 B |

*Primary Examiner*—John Zazworsky
*Attorney, Agent, or Firm*—Craig & Antonelli

[57] ABSTRACT

A semiconductor switch has a pair of PNPN switches connected in an inverse-parallel mode and each includes a switching circuit for protection against the rate effect. Each switch has its gate terminal multi-connected through a capacitive element to provide a terminal, which is connected to the output terminal of a control circuit for generating a voltage pulse in a repetitive manner to bear the difference of potential between the PNPN switches and a capacitive element by means of the capacitive element and to drive the PNPN switches with the aid of a variation of voltage produced in the control circuit.

13 Claims, 8 Drawing Figures

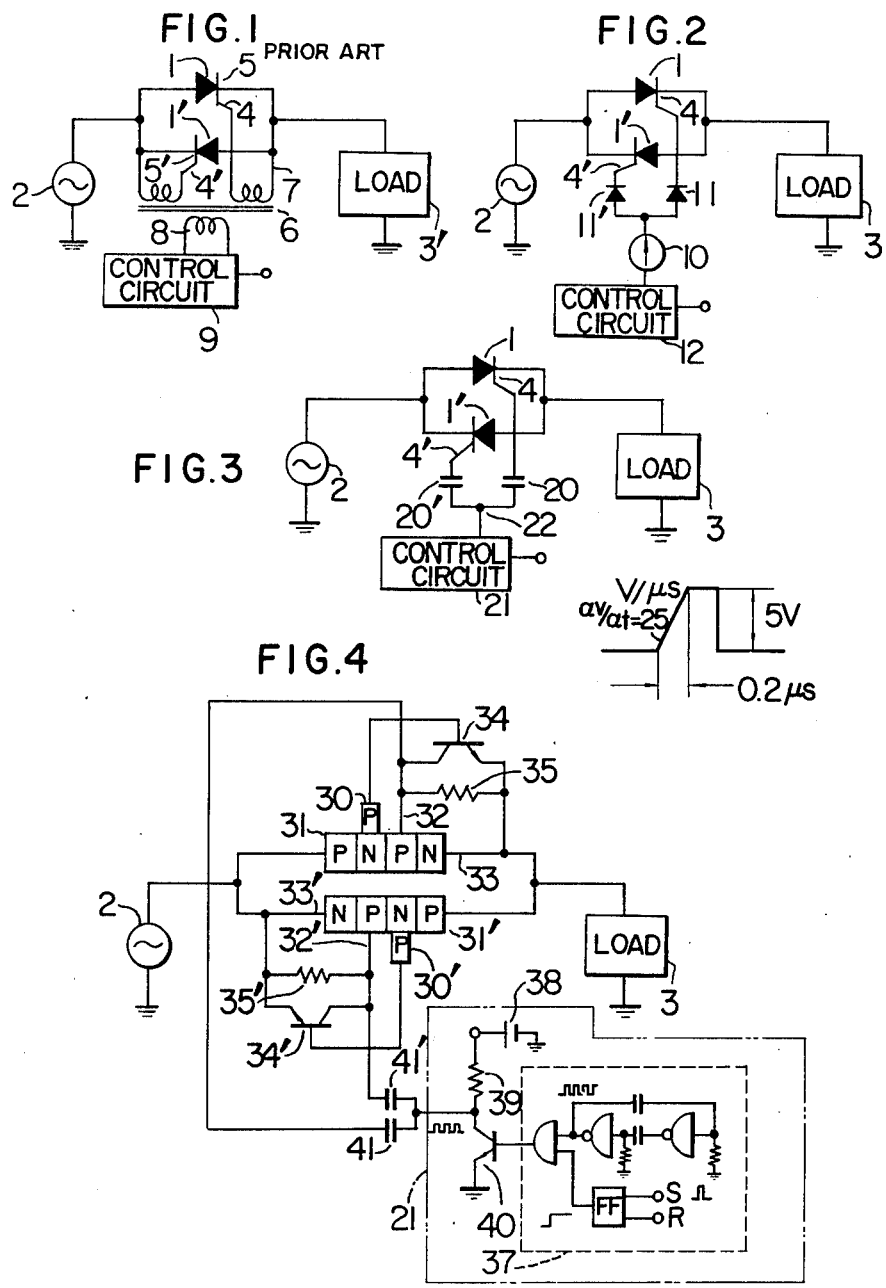

SEMICONDUCTOR SWITCH

The present invention relates to a semiconductor switch using PNPN switches.

A PNPN switch is called and SCR or a thyristor and applied widely in fields ranging from heavy electric equipment to communication devices because of its high switching impedance ratio, self-holding function and its property of a high breakdown voltage.

When a switch including an inverse-parallel connection of these two PNPN switches whose gate terminals are controlled by a control circuit to drive the PNPN switches is connected between an AC power supply and a load, their cathode potential floats positively or negatively from ground potential, so that the gate terminal of the PNPN switch and the control circuit have conventionally been coupled by a transformer. In such a switch arrangement, however, the circuit can be simplified, but disadvantageously cannot be realized in the form of semiconductors because the transformer cannot be formed of an integrated circuit with the result that a small-sized and inexpensive circuit cannot be obtained.

An object of the present invention is to provide a semiconductor switch with a simplified circuit arrangement adapted for use in such cases where the cathode potential floats from a ground potential positively or negatively.

Another object of the present invention is to provide a semiconductor switch with a control circuit capable of being driven by a low voltage and power consumption adapted for use in the above-mentioned cases.

Still another object of the present invention is to provide a semiconductor switch adapted for use in the above-mentioned cases and accessible to the realization of semiconductor integrated circuits and suitable for miniaturization an inexpensiveness.

Other objects of the present invention will be understood from the detailed description of the following embodiments in conjunction with the accompanying drawings.

The present invention provides a semiconductor switch comprising a pair of PNPN switches connected in an inverse-parallel mode and each including a gate terminal and a switching circuit for protection against the rate effect, two capacitive elements and a control circuit for generating a voltage pulse in a repetitive manner, wherein the PNPN switches connected in an inverse-parallel mode have their gate terminals multi-connected through the capacitive elements to provide a terminal, which is connected to the output terminal of the control device, thereby to drive said PNPN switches.

FIG. 1 is a circuit arrangement of a switch using conventional PNPN switches;

FIG. 2 is a circuit diagram of a semiconductor switch according to another technique which applicants have developed;

FIG. 3 is a circuit diagram for illustrating the principle of a semiconductor switch according to the present invention;

FIG. 4 is a circuit diagram showing a first embodiment of a semiconductor switch according to the present invention;

Figure 5:
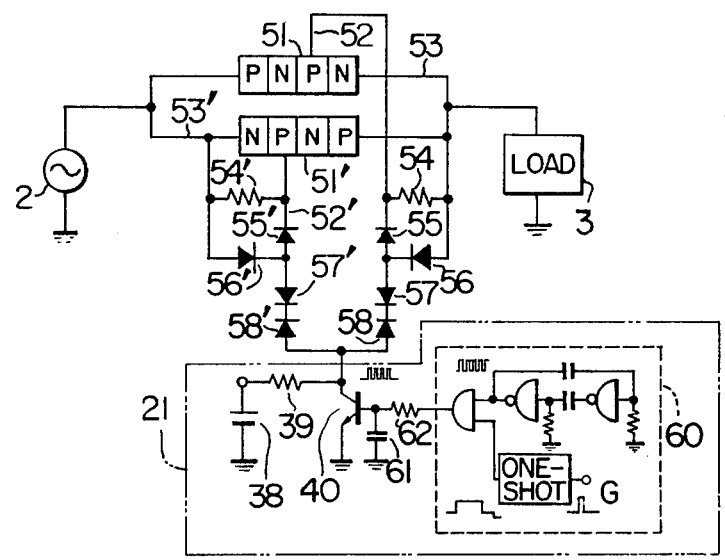
FIG. 5 is a circuit diagram showing a second embodiment of a semiconductor switch according to the present invention.

Prior to the description of the particular embodiments of the present invention, description will be presented in conjunction with FIGS. 1 and 2 to a conventional switch using PNPN switches which are disposed between an AC power supply and a load and adapted for use in a case where their cathode potential float positively or negatively from the ground potential, and to a semiconductor switch according to another technique which applicants have developed.

FIG. 1 shows a conventional semiconductor switch using PNPN switches, and represents the scheme of a known technique in which two PNPN switches 1,1' are connected in an inverse-parallel mode and disposed between a power supply 2 and a load 3, and a transfer 6 has its secondary coils 7,7' connected to gates 4,4' of the PNPN switches 1,1' and its primary coil 8 connected to a control circuit 9. In such an arrangement of the semiconductor switch, the PNPN switches 1,1' are turned on in such a manner that pulse current is suitably applied from the control device 9 to the transformer 6 to induce in the secondary coils 7,7' of the transformer 6 a voltage which causes current to flow into the gate of the PNPN switches 1,1' to drive them. It is apparent, that, for the alternating current supply 2 such as a commercial power supply, the pulses are often applied in synchronism with the alternating current, and for direct current, a single pulse is applied with satisfaction.

The switch as shown in FIG. 1 is so arranged that the transformer 6 is used to couple the PNPN switches 1,1' and the control circuit 9 and is adapted for use in such cases where the cathode potentials, of the PNPN switches 1,1' factor positively or negatively from the ground potential.

This arrangement of the switch is characterized by a simplified circuit, but could not provide miniaturization and inexpensiveness because it is difficult to achieve the circuit in the form of an integrated circuit due to the fact that the transformer cannot be realized by an integrated circuit.

FIG. 2 shows a semiconductor switch according to another technique which applicants have developed and which is adapted for use in such cases. In this figure, the transformer 6 shown in FIG. 1 is replaced by a constant-current circuit 10 to drive the PNPN switches 1,1'. In other words, in the circuit as shown in FIG. 2, the gates 4,4' of the PNPN switches 1,1' are short-circuited through diodes 11,11' are connected to the constant-current circuit 10. The constant-current circuit 10 is controlled by a control circuit 12 and serves to generate constant pulse-like or continuous current. Other parts are the same as those in FIG. 1. In this arrangement, the constant-current circuit can bear the difference of potential between the PNPN switches 1,1' and the control circuit 12 and the transformer 6 such as shown in FIG. 1 is eliminated, so that all the circuits can be realized in the form of semiconductors and of a monolithic integrated circuit. This semiconductor switch, however, also had the following drawbacks that the constant-current circuit will be a complicated circuit including transistors to which a high voltage is applied, and require a large space for its circuit integration, that the constant current circuit itself needs a DC power supply of high voltage when the load 3 is capacitive of inductive, and that the constant-current circuit has a large power consumption.

The present invention is intended to eliminate the drawbacks in the prior art and to provide a PNPN switch driving circuit with simplified and inexpensive circuits, which needs a low voltage for the driving circuit and consumes little power and can be readily realized in the form of a semiconductor integrated circuit.

FIG. 3 shows a circuit diagram for illustrating the principle of the present invention, in which the PNPN switches 1,1' are disposed between the power supply 2 and the load 3 in an inverse-parallel connection mode. The gates 4,4' of the PNPN switches 1,1' are connected to capacitors 20,20', which in turn are connected to a control circuit 21 as shown in the figure. The quantitative description will be given, assuming, for example, that the power AC supply 2 is a commercial supply of 100 Vrms, 50 Hz, the capacitors 20,20' have a capacitance of 100 pF, and the PNPN switches 1,1' have a gate-sensitive current of 1 mA and are driven if a current of 2 mA flows during the time of 0.1 $\mu$S. The control circuit 21 is so constructed that its output 22 is normally kept at a ground potential and it produces a pulse when the PNPN switches 1,1' are desired to be driven. The pulse has rising rate of voltage dv/dt, which is previously set to such a value as will be described later. The path between the gate and cathode of the PNPN switch is typically short-circuited by a resistor, although the latter is shown as being removed from the figure. In this arrangement, non-operation of the control circuit 21 causes the voltage of the load 3 to be applied to the capacitor 20 and the voltage of the power supply 2 to be applied to the capacitor 20' because the output 22 is at the ground potential. Since the power supply 2 is for an alternating current, a current C(dv/dt) derived from the differentiation of voltage flows into the capacitor 20'. This current is even at its peak value as small as:

$$I_{max} = 100 \times 10^{-12} \times 100 \times \sqrt{2} \times 2\pi \times 50 \div 4.5 \mu A$$

because of the low AC frequency and small capacitance. As a result, the PNPN switches 1,1' remain blocked.

The voltage pulse of the control circuit 21 has its waveform so determined that, as shown in figure, the rising rate of voltage dv/dt is 25 V/$\mu$S, that is, it takes 0.2 $\mu$S to increase from 0V to 5 V. Now, the application of this pulse of voltage causes a current of $C(dv/dt) = 100 \times 10^{-12} \times 25 \times 10^6 = 2.5$ mA to flow into the capacitors 20,20'. This leads to the generation of a gate current for the PNPN switches and allows the PNPN switches (in actuality either one of them whose direction coincides with the direction of a load current) to be driven satisfactorily. The repetitive generation of the voltage pulse by means of the control circuit 21 in synchronism with the voltage cycle of the power supply 2, therefore, allows the PNPN switches 1,1' to be driven and made conductive successively. As the case may be, it is possible to make the cycle of the voltage pulse much shorter than the cycle of the power supply 2 to control the PNPN switches out of synchronism with the cycle of the power supply 2.

FIG. 4 is a circuit diagram showing a first embodiment of a semiconductor switch according to the present invention. PNPN switches 31,31' in inverse-parallel connection used in this embodiment have second P-type collector regions 30,30' as shown in the figure. Transistors 34,34' and resistors 35,35' are provided between the gate electrodes 32,32' and cathodes 33,33' of the switches, and the transistors 34,34' have their bases connected to the second P-type collector regions 30,30'. This arrangement is in effect a pair of switch circuits, which makes it possible to provide a high triggering sensitivity and high resistance against the rate effect according to another technique which the present applicant has developed. Although no detailed description is given, this arrangement allows the PNPN switches 31,31' to be driven, for example, with a triggering sensitivity below 100 $\mu$A, while providing thereto a high resistance against the rate effect so that the erroneous triggering of the PNPN switches can be prevented even if an abrupt rise of voltage occurs between the anode and cathode. The power supply 2 and the load 3 are connected to the PNPN switches 31,31'. A control circuit 21 comprises a pulse generator 37 and an output portion comprising a power supply 38, a resistor 39 and a transistor 40. As shown in the figure, the pulse generator 37 comprises a successive-pulse generating circuit with two inverters combined, a flip-flop turned on or off in response to a control signal from an external portion, and an AND gate receiving their signals as an input. The control circuit 21 is connected to the gate electrodes 32,32' of the PNPN switches 31,31' through capacitors 41,41'. In this arrangement, the application of setting signal pulses to the flip-flop of the pulse generator 37 causes the control circuit 21 to generate successive voltage pulses, and make it possible to drive the PNPN switches 31,31' and make them conductive according to the principle which has been described in FIG. 3. Moreover, in the present embodiment, the PNPN switching circuit is provided with special means, that is, the second collector regions 30,30' transistor 34,34' and resistors 35,35', so that it is very sensitive to the driving current applied from the gate side without being erroneously driven in response to the steeply-rising voltage occurring between the anode and cathode. This eliminates the capacitor of large capacitance as described in conjunction with the principle in FIG. 3, and allows the capacitors 41,41' to be reduced in capacitance to be as small as several picofarads. This kind of means is particularly suitable for use in such a case where some of the PNPN switches arranged in a matrix, which exist only at particular addresses, are desired to be driven, and the driven PNPN switch causes the steeply-rising voltage to be produced between the anode and cathode of other PNPN switches.

As described above, the semiconductor switch as shown in FIGS. 3 and 4 according to the present invention includes the capacitive elements, which are connected between the PNPN switches and the control circuit to bear the potential differences between the PNPN switch and control circuit and to drive the PNPN switches in response to the variation in voltage produced from the control circuit. This simplifies the circuit arrangement and advantageously leads to easy realization of an integrated circuit by means of a normal monolithic integrated-circuit technique or hybrid integrated circuit technique with the result that effectual inexpensiveness and reduction in power can be achieved.

FIG. 5 is a circuit diagram showing a second embodiment of a semiconductor switch according to the present invention. PNPN switches 51,51' are connected in an inverse-parallel mode between the power supply 2 and load 3, and resistors 54,54' are connected between their gate electrodes 52,52' and cathodes 53,53'. Diodes 55,55' are so connected to the gate electrodes 52,52' that their forward direction is a direction in which a current flows into the gate electrodes 52,52', and diodes 56,56' are so connected between the cathodes 53,53' and gate electrodes 52,52' that their forward direction is a direction in which a current flows out of the cathode. This forms a circuit for rectifying a control signal relative to the gate electrode. Further, diodes 57,58, 57', 58', serving as capacitors 41,41' in FIG. 4, are connected in an inverse-series connection mode as shown in the figure so as not to permit a direct current to flow negatively or positively relative to the ground. It is to be noted that, for the power supply 2 whose polarity is either positive or negative, the diodes can be removed whose forward direction coincides with the polarity of the power supply 2. The control circuit 21 is substantially similar to the control circuit shown in FIG. 4, but includes a pulse generator 60 in which the flip-flop is replaced by a one-shot multivibrator operating for a certain time after reception of a signal to generate once a predetermined number of voltage pulses. A capacitor 61 and a resistor 62 are further provided at the output portion for defining the output waveform of pulse, particularly the rising and falling of the voltage. It will be understood that the PNPN switching circuit having the inverse-parallel connection can be constituted as shown in FIG. 4 so as to obtain the high triggering sensitivity and high resistance against the rate effect. The primary feature of the circuit shown in FIG. 5 is that the diodes 55,56,55',56' serve to provide a rectifying function to the gate circuit of the PNPN switches 51,51'. This allows easier driving than the driving in the circuit of FIG. 4 by the following reason. Referring back to the embodiment as shown in FIG. 4, the rising of the output voltage from the control device 21 causes the gate current to flow into the gate electrodes 32,32' of the PNPN switches 31,31' through the capacitors 41,41', while the falling of the output voltage from the control device 21 causes a current to flow in a backward direction, i.e., in a direction in which the current flows away from the gate electrode. This backward current leads to a slight deterioration of the substantial triggering sensitivity. In the embodiment as shown in FIG. 5, on the other hand, a current in the flowing-in direction always passes through the gate electrodes 52,52' due to the gate circuit provided with a rectifying function with the result of easy driving.

In each of the above-mentioned embodiments, the PNPN switch is so constructed as to be driven by causing a current to flow into its gate, but the present invention can be achieved as will be described later, using PNPN switches (having an anode-gate electrode) which can be driven by causing the current to flow out of the gate.

Figure 6:
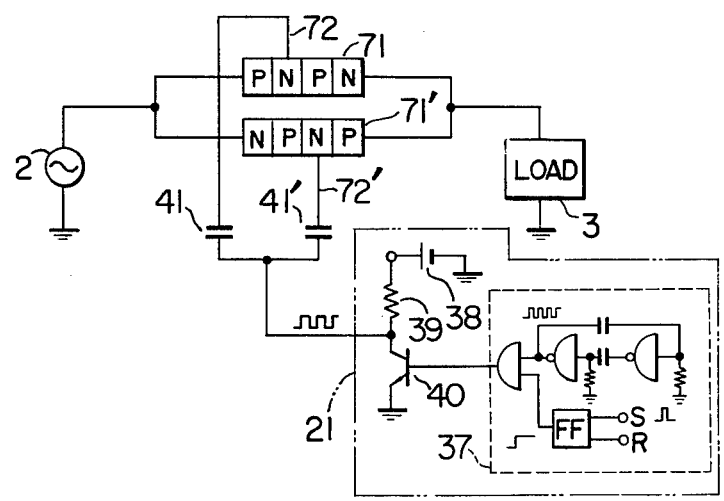
FIG. 6 is a circuit diagram showing a third embodiment of a semiconductor switch according to the present invention.

FIG. 6 is a circuit diagram showing a third embodiment of the present invention, in which PNPN switches 71,71' are connected in an inverse-parallel mode and have anode-gate electrodes 72,72', which are coupled to the control circuit through the capacitors 41,41'. Other portions are similar to those in FIG. 4. The semiconductor switch of this structure causes a current to flow out of the anode-gate electrodes 72,72' direction in which the capacitors 41,41' are charged when the output voltage of the control circuit 21 falls (i.e., when the transistor 40 is being turned on) and thus make the gate driving possible. In FIG. 6, a method for setting the resistance against a rate effect of the PNPN switches 71,71' has not been described, but means as shown in FIG. 4 or other means are applicable.

Figure 7:
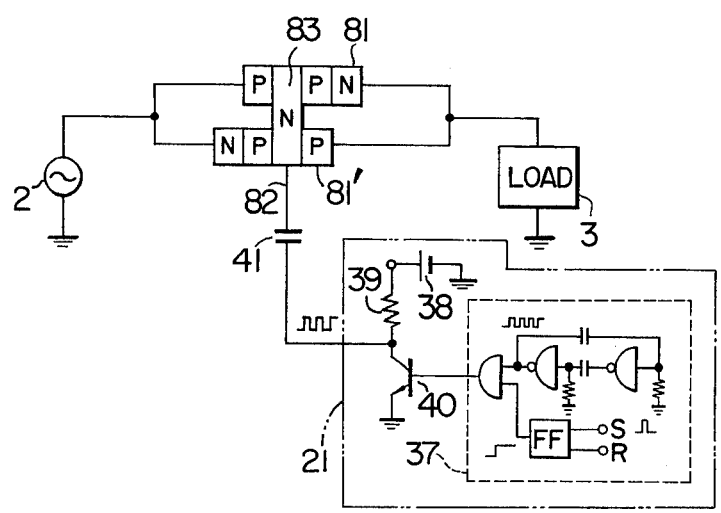
FIG. 7 is a circuit diagram showing a fourth embodiment of the present invention.

FIG. 7 is a circuit diagram showing a fourth embodiment of the present invention, intended to make the embodiment of FIG. 6 more inexpensive. In the embodiment as shown in FIG. 7, two PNPN switches 81,81' connected in an inverse-parallel mode have their anode-gate regions 83 made common to form an anode-gate electrode 82, which is connected to the control circuit 21 through the capacitor 41. The arrangement in which the anode-gate regions are made common and the two PNPN switches are brought into the inverse-parallel connection can be attained without any hindrance by means of semiconductor integrated circuit technique, and has substantially the same function as that of the embodiment in which other separate PNPN switches are connected in an inverse-parallel mode. In FIG. 7, a method for setting the resistance against a rate effect of the PNPN switches 81,81' has not been described, but means as shown in FIG. 4 or other means are applicable.

Figure 8:
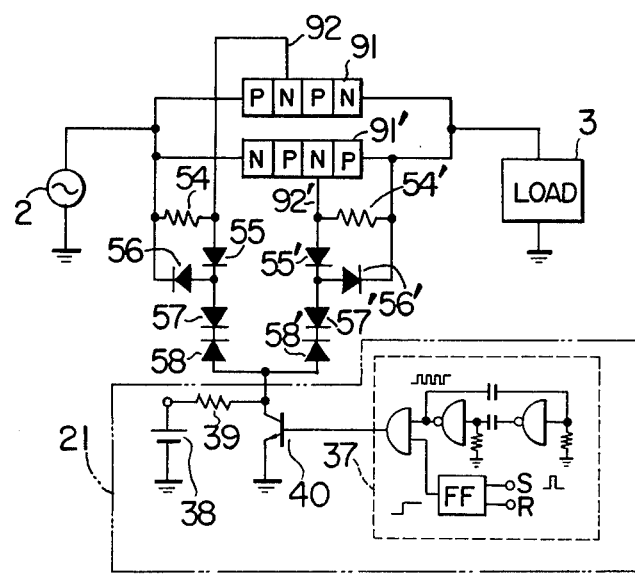
FIG. 8 is a circuit diagram showing a fifth embodiment of the present invention.

FIG. 8 is a circuit diagram of a fifth embodiment of the present invention. PNPN switches 91,91' having anode-gate electrodes 92,92' are connected in an inverse-parallel mode, and the technique as shown in FIG. 5 is applied to the anode-gate electrodes 92,92'. The arrangement is substantially the same as that shown in FIG. 5 with the exception that diodes 55,55', 56,56' are connected so as to provide a rectifying function by which current flows out of the anode-gate electrodes 92,92'. A description is not given, therefore, of the operations and effects of this circuit.

What is claimed is:

1. A semiconductor switch comprising:
   a pair of first and second PNPN switches each having a gate terminal and being connected in inverse-parallel relationship with each other between an AC power supply and a load, so that said PNPN switches are adapted for use where their cathode potentials float from ground potential to positive and negative potentials;
   a first and a second capacitive element, each of which is capable of blocking D.C. current flow in both directions therethrough; and
   a control circuit having an output terminal for generating a voltage pulse in a repetitive manner, the gate terminal of said first PNPN switch being connected to said output terminal through said first capacitive element, and the gate terminal of said second PNPN switch being connected to said output terminal through said second capacitive element, to thereby drive said PNPN switches.

2. A semiconductor switch comprising:
   a pair of first and second PNPN switches each having at least three PN junctions and including four semiconductor regions comprised of an anode, an anode gate, a cathode gate and a cathode, said PNPN switches being connected in inverse-parallel relationship with each other between an AC power supply and a load, so that said PNPN switches are adapted for use where their cathode potentials float from ground potential to positive and negative potentials;
   two switch circuits each having an input and an output terminal connected across one of said PN junctions adjacent to one end region of said respective PNPN switches, and a control terminal supplied with a current derived from a current flowing through another one of said PN junctions adjacent to the other end region of said respective PNPN switches thereby to provide protection against the rate effect;

a first and a second capacitive element; and a control circuit having an output terminal for generating a voltage pulse in a repetitive manner, the cathode gate region of said first PNPN switch being connected to said output terminal through said first capacitive element, and the cathode gate region of said second PNPN switch being connected to said output terminal through said second capacitive element, to thereby drive said PNPN switches.

3. A semiconductor device as set forth in claim 2, wherein said capacitive element comprises a capacitor.

4. A semiconductor device as set forth in claim 2, wherein said capacitive element comprises the junction capacitance of a diode.

5. A semiconductor device as set forth in claim 2, wherein said capacitive element comprises two diodes connected in inverse-series relationship to provide a composite junction capacitance.

6. A semiconductor switch comprising:

a pair of first and second PNPN switches each having at least three PN junctions and including four semiconductor regions comprised of an anode, an anode gate, a cathode gate and a cathode, said PNPN switches being connected in inverse-parallel relationship with each other between an AC power supply and a load, so that said PNPN switches are adapted for use where the cathode potentials thereof float from ground potential to positive and nagative potentials;

two switch circuits each having an input and an output terminal connected respectively to said cathode gate and cathode regions, and a control terminal supplied with a current derived from a current flowing through one of said PN junctions adjacent to said anode region thereby to provide protection against the rate effect;

a first and a second capacitive element;

a first, a second, a third, and a fourth diode; and a control circuit having an output terminal for generating a voltage pulse in a repetitive manner, said cathode gate region of said first PNPN switch being connected to said output terminal through a first series circuit of said first capacitive element and said first diode, said cathode gate region of said second PNPN switch being connected to said output terminal through a second series circuit of said second capacitive element and said second diode, said first and second diodes being so connected that their forward direction is a direction in which current flows into said cathode gate region, said third diode being connected between the cathode region of said first PNPN switches and an intermediate point of said first series circuit, said fourth diode being connected between the cathode region of said second PNPN swtich and an intermediate point of said second series circuit, said third and fourth diodes being so connected that their forward direction is toward said intermediate point.

7. A semiconductor switch as set forth in claim 6, wherein said capacitive element comprises a capacitor.

8. A semiconductor switch as set forth in claim 6, wherein said capacitive element comprises a junction capacitance of a diode.

9. A semiconductor switch as set forth in claim 7, wherein said capacitive element comprises two diodes connected in inverse-series relationship to provide a composite junction capacitance.

10. A semiconductor switch comprising:

a pair of first and second PNPN switches each having at least three PN junctions and including four semiconductor regions comprised of an anode, an anode gate, a cathode gate and a cathode, said PNPN switches being connected in inverse-parallel relationship with each other between an AC power supply and a load, so that said PNPN switches are adapted for use where the cathode potentials thereof float from groun potential to positive and negative potentials;

two switch circuits each having an input and an output terminal connected respectively to said cathode gate and cathode regions, and a control terminal being supplied with current derived from current flowing through one of said PN junctions adjacent to said anode region to thereby provide protection against the rate effect;

a first and a second capacitive element;

a first, a second, a third, and a fourth diode; and a control circuit having an output terminal for generating a voltage pulse in a repetitive manner, the anode gate region of said first PNPN switch being connected to said output terminal through a first series circuit of said first capacitive element and said first diode, the anode gate region of said second PNPN switch being connected to said output terminal through a second series circuit of said second capacitive element and said second diode, said first and second diodes being so connected that their forward direction is a direction in which a current is derived from said anode gate, said third diode being connected between the anode region of said first PNPN switch and an intermediate point of said first series circuit, said fourth diode being connected between the anode region of said second PNPN switch and an intermediate of said second series circuit, said third and fourth diodes being so connected that their backward direction is toward said intermediate point, thereby to drive said PNPN switches.

11. A semiconductor switch comprising:

a pair of first and second PNPN switches each having at least three PN junctions and including four semiconductor regions comprised of an anode, an anode gate, a cathode gate and a cathode, said PNPN switches being connected in inverse-parallel relationship between an AC power supply and a load, so that their cathode potentials float from ground potential to positive and negative potentials;

two switch circuits each having an input and an output terminal connected respectively to said cathode gate and said cathode, and a control terminal supplied with current derived from current flowing through one of said PN junctions adjacent to said anode region to provide protection against the rate effect;

a capacitive element; and a control circuit having an output terminal for generating a voltage pulse in a repetitive manner, the anode gate regions of said first and second PNPN switches being formed in common and connected to said output terminal through said capacitive element, to thereby drive said PNPN switches.

12. A semiconductor switch comprising:
a pair of first and second PNPN switches each having at least three PN junctions and including four semiconductor regions comprised of an anode, an anode gate, a cathode gate and a cathode, and a P-type collector region disposed on said anode gate region; said PNPN switches being connected in inverse-parallel relationship between an AC power supply and a load, so that their cathode potentials float from ground potential to positive and negative potentials;
two switch circuits each having an input and an output terminal connected respectively to said cathode gate and cathode regions, and a control terminal supplied with a current derived from a current flowing through one of said PN junctions adjacent to said anode region to provide protection against the rate effect;
a first and a second capacitive element; and
a control circuit having an output terminal for generating a voltage pulse in a repetitive manner, said cathode gate region of said first PNPN switch being connected to said output terminal through said first capacitive element, and said cathode gate region of said second PNPN switch being connected to said output terminal through said second capacitive element, to thereby drive said PNPN switches.

13. A semiconductor switch comprising:
a pair of first and second PNPN switches each having at least three PN junctions and including four semiconductor regions comprised of an anode, an anode gate, a cathode gate and a cathode, said PNPN switches being connected in inverse-parallel relationship between an AC power supply and a load, so that their cathode potentials float from ground potential to positive and negative potentials;
two switch circuits each having input and output terminals connected respectively to said cathode gate and cathode regions, and a control terminal supplied with current derived from current flowing through one of said PN junctions adjacent to said anode region to provide protection against the rate effect;
a first and a second capacitive element; and
a control circuit having an output terminal for generating a voltage pulse in a repetitive manner, the anode gate region of said first PNPN switch being connected to said output terminal through said first capacitive element, and the anode gate region of said second PNPN switches being connected to said output terminal through said second capacitive element, to thereby drive said PNPN switches.

* * * * *